US007476957B2

(12) United States Patent
Watanabe et al.

(10) Patent No.: US 7,476,957 B2
(45) Date of Patent: Jan. 13, 2009

(54) SEMICONDUCTOR INTEGRATED CIRCUIT

(75) Inventors: Shinji Watanabe, Osaka (JP); Daisaku Ikoma, Osaka (JP); Kyoji Yamashita, Kyoto (JP); Katsuhiro Ootani, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/979,669

(22) Filed: Nov. 7, 2007

(65) Prior Publication Data

US 2008/0142898 A1    Jun. 19, 2008

(30) Foreign Application Priority Data

Dec. 18, 2006    (JP)    ............... 2006-339914

(51) Int. Cl.
*H01L 21/26* (2006.01)

(52) U.S. Cl. ..................................... 257/499

(58) Field of Classification Search ......... 257/202–206, 257/123, 369, 499, E21.602
See application file for complete search history.

(56) References Cited

U.S. PATENT DOCUMENTS 5,796,128 A * 8/1998 Tran et al. ............... 257/202
5,920,089 A * 7/1999 Kanazawa et al. ............ 257/202
6,732,344 B2 * 5/2004 Sakamoto et al. ............... 716/10
2005/0280031 A1 * 12/2005 Yano ........................ 257/202

FOREIGN PATENT DOCUMENTS

JP    2005-150731    6/2005

* cited by examiner

*Primary Examiner*—Nathan W Ha
(74) *Attorney, Agent, or Firm*—McDermott Will & Emery LLP (57) ABSTRACT

An integrated circuit includes: a first well of a first conductivity type; a second well of a second conductivity type coming into contact with the first well at a well boundary extending in a gate length direction; a first transistor having a first active region of the second conductivity type provided in the first well; and a second transistor which has a second active region of the second conductivity type provided in the first well and differing from the first active region in length in a gate width direction. The center location of the first active region in the gate width direction is aligned with the center location of the second active region in the gate width direction with reference to the well boundary.

11 Claims, 8 Drawing Sheets

STIn8+0.5*Wn8=STIn9+0.5*Wn9= STIn10+0.5*Wn10
STIp8+0.5*Wp8=STIp9+0.5*Wp9= STIn10+0.5*Wn10

SEMICONDUCTOR INTEGRATED CIRCUIT

BACKGROUND OF THE INVENTION (a) Fields of the Invention

The present invention relates to semiconductor integrated circuits made by integrating a great number of MIS transistors.

(b) Description of Related Art

With rapid miniaturization of semiconductor integrated circuits, layout pattern, arrangement, and the like of circuit elements have been diversified and complicated in system LSIs (Large Scale Integrations) and the like. Because of this trend, in development of such system LSIs, it becomes difficult to improve the simulation accuracy of a circuit simulator.

Typically, from a mask layout of a designed cell, information on connection between elements such as transistors, capacitors, and resistors, and in addition information on element characteristics such as transistor size, parasitic capacitance, parasitic resistance, and the like are extracted as a net list using a layout parameter extraction (abbreviated hereinafter as "LPE") of a circuit, and the extracted information is reflected to the circuit simulator. Complicated transistor-characteristic information is modeled in the form of an electric characteristic equation using model parameters of the transistors extracted from the mask layout, and the modeled information is reflected to a circuit simulator. This offers a highly accurate simulation.

However, with recent miniaturization of elements, a problem has arisen that a large characteristic difference occurs between an ideal single transistor used to extract model parameters and a CMOS (Complementary Metal Oxide Semiconductor)-type transistor arranged in a cell widely used in actual design. One of such problems includes characteristic fluctuation of a transistor resulting from the well proximity effect.

In the CMOS structure, an n-type well and a p-type well are formed in a single substrate, and elements such as a p-channel type MISFET (Metal-Insulator-Semiconductor Field Effect Transistor) and an n-channel type MISFET are formed thereon. In this structure, the well regions are formed so that the regions other than the well regions are covered with a photoresist and then using this photoresist as a mask, ions with high energies are implanted into the substrate.

During this implantation, some of impurity ions implanted at high energies scatter within the photoresist, and are emitted from the photoresist and then implanted into the well regions. As a result of this, if the MISFET is formed at an end of the well region, the impurity ions scattered within the photoresist affect the MISFET to fluctuate the threshold voltage thereof (see, for example, Japanese Unexamined Patent Publication No. 2005-150731). This phenomenon is called the well proximity effect.

In order to reduce the influence of the well proximity effect, technical development is being made for the purpose of modeling characteristic fluctuation by the well proximity effect and reflecting the modeled one to a circuit simulator. However, it is feared that such reflection of the modeled characteristic fluctuation to the circuit simulator increases simulation time and development time. Furthermore, the range affected by the well proximity effect is as large as several micrometers, so that highly accurate modeling within realistic simulation time is difficult. This will be described a little more specifically.

Figure 8:
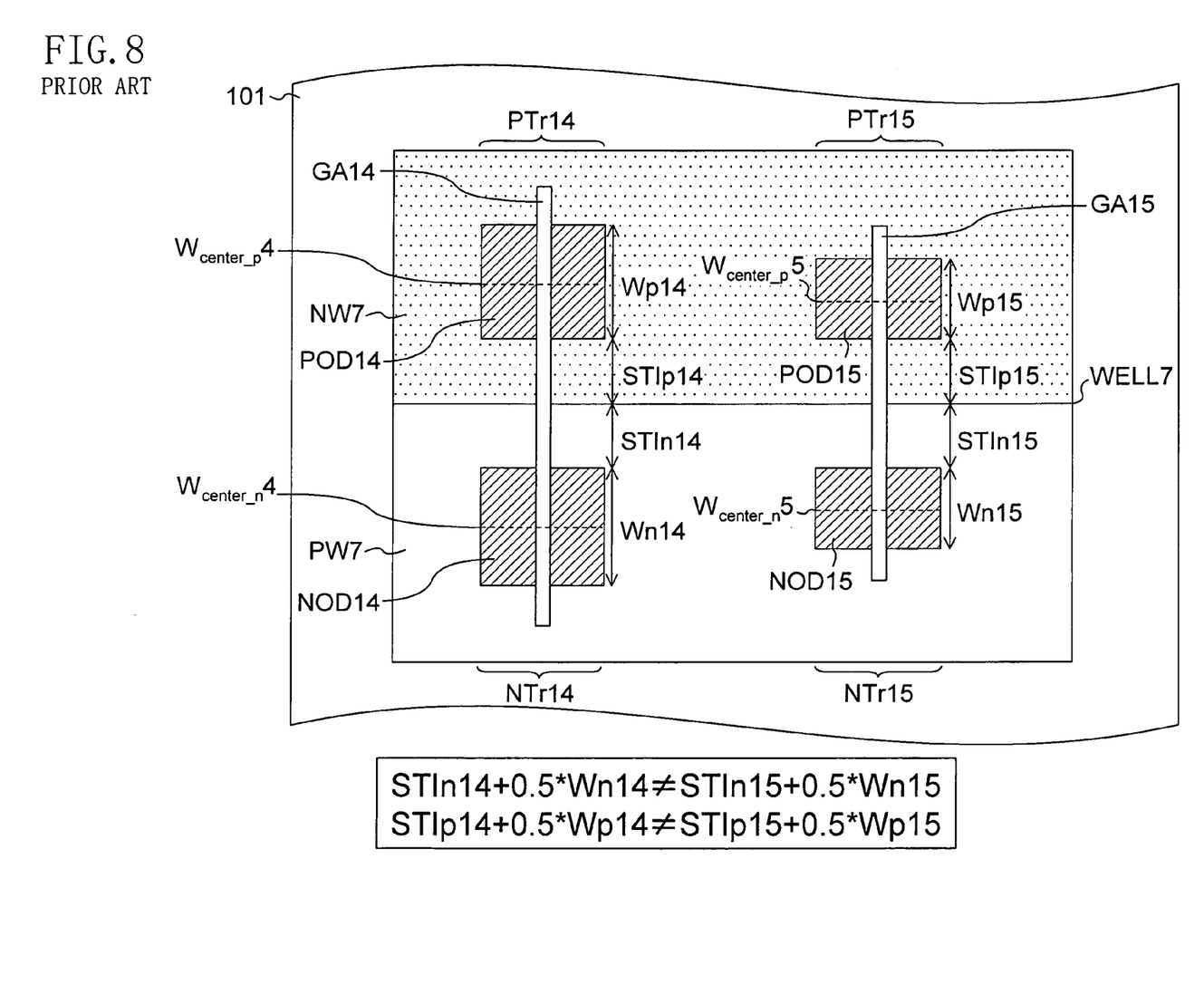
FIG. 8 is a plan view showing an example of a conventional cell constituting a system LSI.

Recent system LSIs have been designed by cell-based design methods. FIG. 8 is a plan view showing an example of a conventional cell constituting a system LSI. The transistor arrangement in the cell varies according to functions and applications of a logic circuit configured by the cell, and a plurality of cells as shown in FIG. 8 are used in combination to design the system LSI.

In the conventional example shown in FIG. 8, p-type active regions POD14 and POD15 having gate widths of Wp14 and Wp15, respectively, are arranged in an n-type well NW7 formed in a semiconductor substrate 101. Also, n-type active regions NOD14 and NOD15 having gate widths of Wn14 and Wn15, respectively, are arranged in a p-type well PW7 formed in the semiconductor substrate 101. Gate interconnects GA14 and GA15 are formed above the p-type active regions POD14 and POD15 and the n-type active regions NOD14 and NOD15, respectively. P-channel transistors PTr14 and PTr15 and n-channel transistors NTr14 and NTr15 composed of these respective components are arranged in the cell. Letting WELL7 denote the boundary between the n-type well NW7 and the p-type well PW7 (abbreviated hereinafter as "the well boundary"), in PTr14, the distance from WELL7 to the end of POD14 is represented as STIp14, and in NTr14, the distance from WELL7 to the end of NOD14 is represented as STIn14. Likewise, in PTr15, the distance from WELL7 to the end of POD15 is represented as STIp15, and in NTr15, the distance from WELL7 to the end of NOD15 is represented as STIn15. Thus, the calculated distance of PTr14 from the well boundary is represented as $(STIp14+0.5\times Wp14)$, the calculated distance of NTr14 from the well boundary is represented as $(STIn14+0.5\times Wn14)$, the calculated distance of PTr15 from the well boundary is represented as $(STIp15+0.5\times Wp15)$, and the calculated distance of NTr15 from the well boundary is represented as $(STIn15+0.5\times Wn15)$.

In this configuration, in the transistors with the active regions having different gate widths, the distances from the well boundary to the centers of the active regions in the gate width direction satisfy the following relations:

$$(STIp14+0.5\times Wp14) \neq (STIp15+0.5\times Wp15) \quad (1)$$

$$(STIn14+0.5\times Wn14) \neq (STIn15+0.5\times Wn15) \quad (2)$$

It is known that the amount of change in the threshold voltage of the transistor due to impurity concentration change associated with the well proximity effect is proportional to the square root of the impurity concentration and thus an increase in the impurity concentration caused by the well proximity effect is inversely proportional to the distance from the well boundary. As shown in the above expressions (1) and (2), since the transistors differ in the distance from the well boundary to the center of the active region in the gate width direction, characteristic fluctuation affected by the well proximity effect also differs among the transistors. Circuit simulation taking the well proximity effect into consideration can be performed. However, with this simulation, it is difficult to evaluate the transistor characteristics in a short time, which is likely to cause lengthening of development time and an increase in development cost.

SUMMARY OF THE INVENTION

An object of the present invention is to provide a semiconductor integrated circuit capable of being simulated accurately and efficiently with the well proximity effect taken into consideration.

A semiconductor integrated circuit according to the present invention includes: a first well region of a first conductivity type provided in a substrate; a second well region of a second conductivity type provided in the substrate and coming into contact with the first well region at a well boundary extending in a gate length direction; a first active region provided in the first well region and having first source and drain regions of the second conductivity type; and a second active region provided in the first well region, having second source and drain regions of the second conductivity type, and differing in length in a gate width direction from the first active region. In this circuit, the center location of the first active region in the gate width direction is aligned with the center location of the second active region in the gate width direction with reference to the well boundary.

As described above, among the transistors of the single well, by equalizing the distances from the well boundary to the centers of the active regions thereof, the influence of the well proximity effect can be prevented from varying among the transistors with different sizes, thereby minimizing characteristic fluctuation caused by the influence of the well proximity effect. Moreover, with the semiconductor integrated circuit according to the present invention, characteristic fluctuation of the transistor can be prevented which results from process variations, modeling error caused in the case where for the circuit simulator the influence of the well proximity effect is taken into consideration, and the like. This makes simulation error smaller on the LSI level or the block level, so that a decrease in the design period can be attained and in addition an increase in development cost can be prevented.

As is apparent from the above, with the semiconductor integrated circuit of the present invention, after determination of process conditions for each generation, the influence of the well proximity effect can be made equal on each of the transistors in the single well. Therefore, highly accurate circuit simulation can be performed even without carrying out the step of evaluating characteristic fluctuation and performing modeling. Also in the case where for the circuit simulator the influence of the well proximity effect is taken into consideration, the influence of relative characteristic fluctuation caused by simulation error due to modeling error, process variations, or the like can be suppressed.

Accordingly, highly accurate circuit simulation can be performed to prevent increases in development period and development cost.

DETAILED DESCRIPTION OF THE PREFERRED EMBODIMENTS

First Embodiment

Hereinafter, a semiconductor integrated circuit and its design method according to a first embodiment of the present invention will be described with reference to the accompanying drawings.

Figure 1:
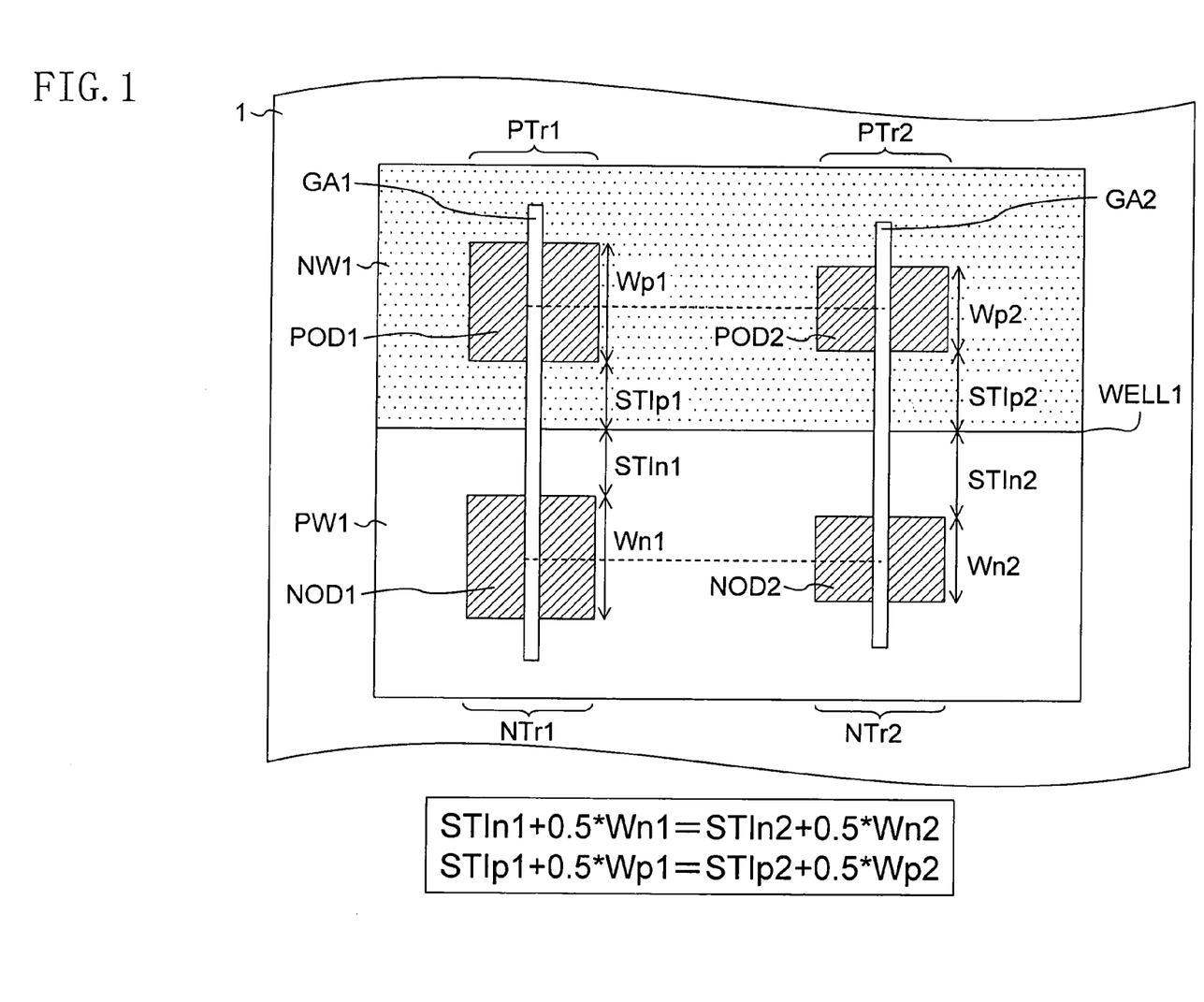
FIG. 1 is a plan view schematically showing a standard cell constituting a semiconductor integrated circuit according to a first embodiment of the present invention.

FIG. 1 is a plan view schematically showing a standard cell constituting the semiconductor integrated circuit according to the first embodiment of the present invention. In the specification and the scope of claims of the present invention, the standard cell indicates the area where CMIS transistors and the like are arranged and connected in order to implement one function or multiple functions (logic inversion, AND, and the like).

Referring to FIG. 1, in the semiconductor integrated circuit according to the first embodiment, an n-type well NW1 and a p-type well PW1 in contact with the n-type well NW1 at a well boundary WELL1 extending in the gate length direction are provided in a substrate 1 made of silicon or the like.

P-type active regions POD1 and POD2 having lengths in the gate width direction (referred hereinafter to as "gate width") of Wp1 and Wp2 (Wp1>Wp2), respectively, are arranged in the n-type well NW1, and n-type active regions NOD1 and NOD2 having gate widths of Wn1 and Wn2 (Wn1>Wn2), respectively, are arranged in the p-type well PW1. Above the p-type active regions POD1 and POD2 and the n-type active regions NOD1 and NOD2, gate interconnects GA1 and GA2 extending in the gate width direction are provided with respective gate insulating films (not shown) interposed therebetween. The p-type active regions POD1 and POD2 and the n-type active regions NOD1 and NOD2 are isolated from each other by an isolation region formed in the substrate 1. In this specification, the p-type active region indicates the region where p-type source and drain regions are formed, and the n-type active region indicates the region where n-type source and drain regions are formed.

A p-channel transistor PTr1 and a p-channel transistor PTr2 are provided in the n-type well NW1. The p-channel transistor PTr1 has the p-type active region POD1 and a portion of the gate interconnect GA1 (a gate electrode) described above, and the p-channel transistor PTr2 has the p-type active region POD2 and a portion of the gate interconnect GA2 (a gate electrode) described above. An n-channel transistor NTr1 and an n-channel transistor NTr2 are provided in the p-type well PW1. The n-channel transistor NTr1 has the n-type active region NOD1 and a portion of the gate interconnect GA1 (a gate electrode) described above, and the n-channel transistor NTr2 has the n-type active region NOD2 and a portion of the gate interconnect GA2 (a gate electrode) described above. In the specification and the scope of claims of the present invention, "gate length direction" indicates the direction in which carriers travel in a region immediately below the gate electrode of the MIS transistor provided above the well, and "gate width direction" indicates the direction extending, on the main surface of the substrate 1, perpendicularly to the gate length direction. The n-type well NW1, the p-type well PW1, and the active regions are shaped in easy-to-design forms, for example, in quadrangular forms. In the cell shown in FIG. 1, using the well boundary WELL1 as an axis, the p-type well PW1 and the n-type active regions NOD1 and NOD2 provided in the top of the p-type well PW1 are arranged axisymmetrically with respect to the n-type well NW1 and the p-type active regions POD1 and POD2 provided in the top of the n-type well NW1.

In this configuration, as shown in FIG. 1, in the p-channel transistor PTr1, the distance from the well boundary WELL1 to the end of the p-type active region POD1 is represented as STIp1, and in the n-channel transistor NTr1, the distance from the well boundary WELL1 to the end of NOD1 is represented as STIn1. Likewise, in the p-channel transistor PTr2, the distance from the well boundary WELL1 to the end of POD2 is represented as STIp2, and in NTr2, the distance from WELL1 to the end of the n-type active region NOD2 is represented as STIn2. Thus, in performing circuit simulation, the distance of the p-channel transistor PTr1 from the well boundary WELL1 can be represented as (STIp1+0.5×Wp1), the distance of the n-channel transistor NTr1 from the well boundary WELL1 can be represented as (STIn1+0.5×Wn1), the distance of the p-channel transistor PTr2 from the well boundary WELL1 can be represented as (STIp2+0.5×Wp2), and the distance of the n-channel transistor NTr2 from the well boundary WELL1 can be represented as (STIn2+0.5×Wn2). In each of the transistors, the reason why the gate width of the active region is multiplied by 0.5 is that the distance from the transistor to the well boundary WELL1 is approximated by the distance from the center of the active region in the gate width direction to the well boundary WELL1, thereby facilitating calculating operation.

The semiconductor integrated circuit according to the first embodiment is characterized in that in the case where the active regions having different gate widths are adjacently arranged in the single cell, in the standard cells constituting a cell array, the center positions of the active regions of each of the cells in the gate width direction are aligned with reference to the well boundary WELL1. To be more specific, in the single cell, the distance from the center of one active region in the gate width direction to the well boundary WELL1 is substantially equal to the distance from the center of another active region in the gate width direction to the well boundary WELL1. Therefore, the following equations hold.

$$(STIp1+0.5\times Wp1)=(STIp2+0.5\times Wp2) \quad (3)$$

$$(STIn1+0.5\times Wn1)=(STIn2+0.5\times Wn2) \quad (4)$$

In the first embodiment, for the p-channel transistors PTr1 and PTr2, Wp1>Wp2 and STIp1<STIp2. On the other hand, for the n-channel transistors NTr1 and NTr2, Wn1>Wn2 and STIn1<STIn2. As described above, among the transistors, by equalizing the distances from the well boundary to the centers of the active regions thereof, the influence of the well proximity effect can be prevented from varying among the transistors with different sizes, thereby minimizing characteristic fluctuation caused by the influence of the well proximity effect. Moreover, with the semiconductor integrated circuit according to the first embodiment, characteristic fluctuation of the transistor can be prevented which results from process variations, modeling error caused in the case where for the circuit simulator the influence of the well proximity effect is taken into consideration, and the like. This makes simulation error smaller on the LSI level or the block level, so that a decrease in the design period can be attained and in addition an increase in development cost can be prevented.

Figure 2:
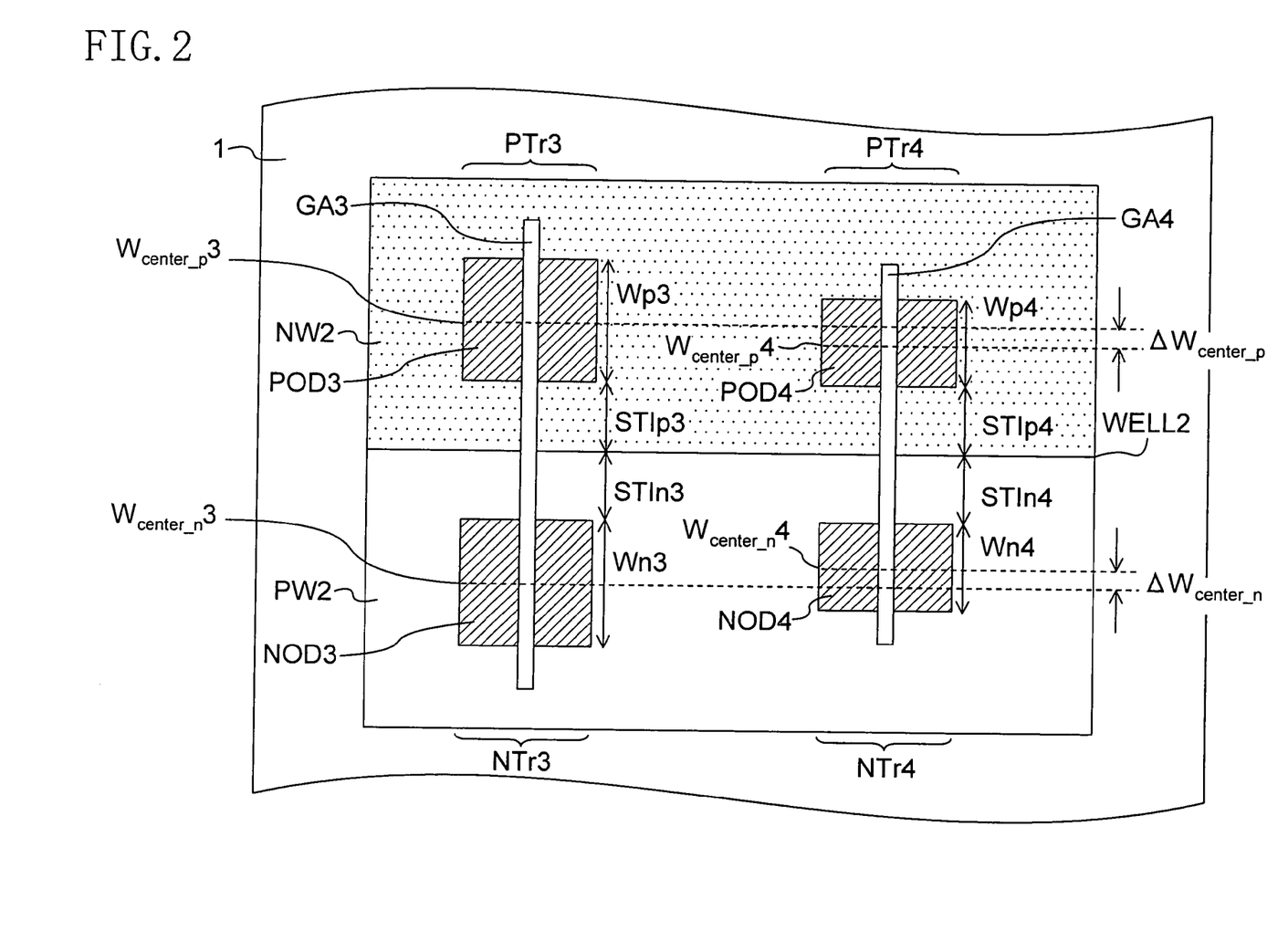
FIG. 2 is a plan view showing a semiconductor integrated circuit designed in order to estimate the influence of the well proximity effect.
Figure 3A:
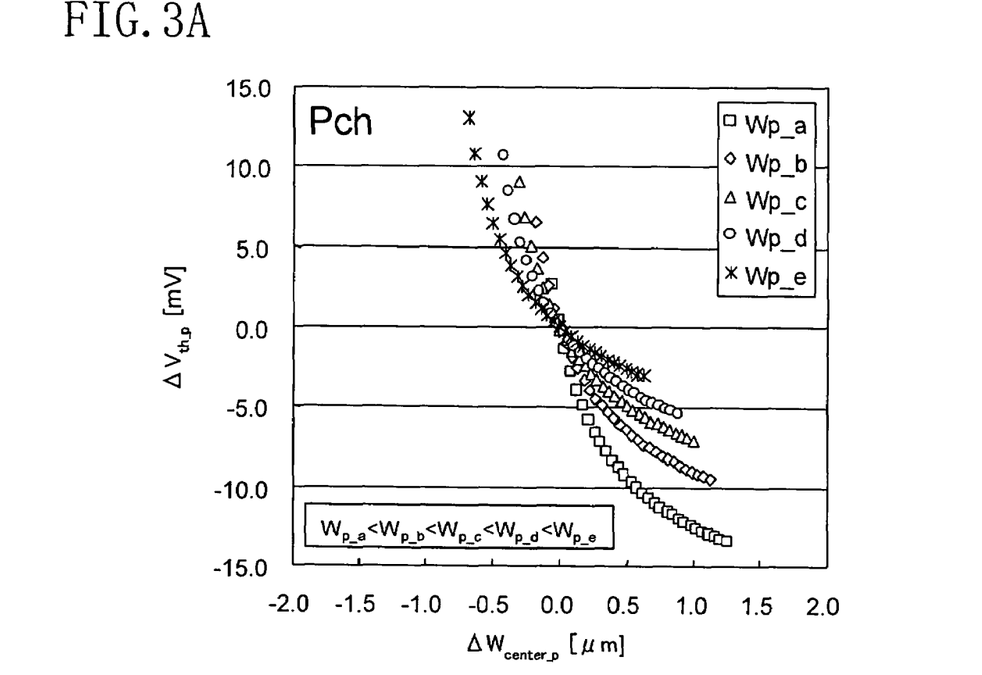
FIGS. 3A and 3B are graphs showing one example of the result obtained by estimating a variation of transistor threshold affected by the well proximity effect in the case where the location of one active region is changed in the semiconductor integrated circuit.
Figure 3B:
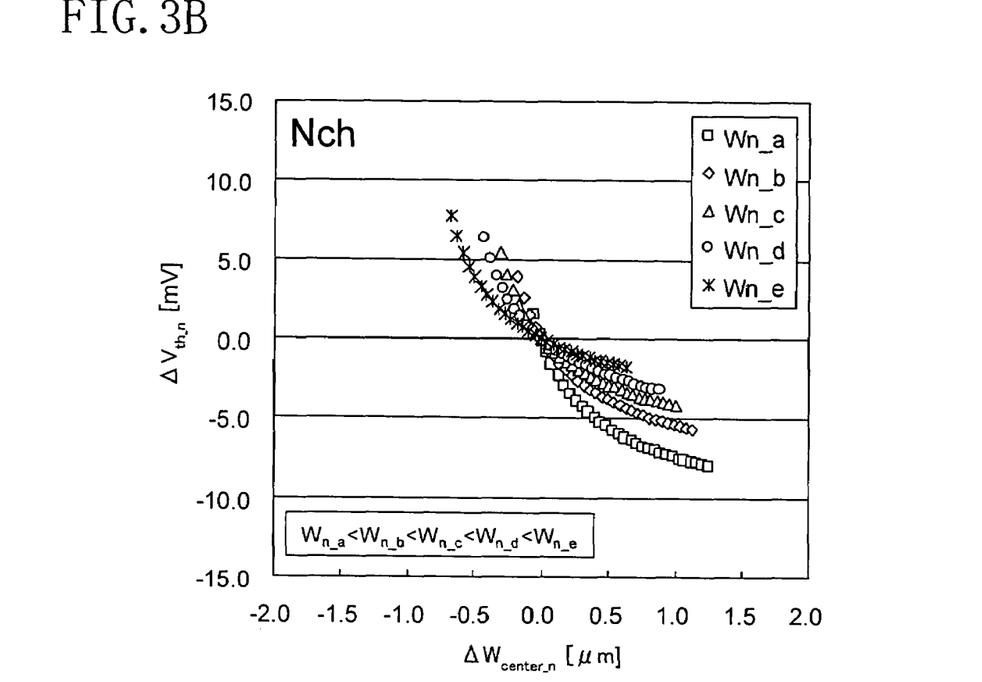

FIG. 2 is a plan view showing a semiconductor integrated circuit designed in order to estimate the influence of the well proximity effect, and FIGS. 3A and 3B are graphs showing one example of the result obtained by estimating a variation of transistor threshold affected by the well proximity effect in the case where the location of one active region is changed in the semiconductor integrated circuit.

In FIG. 2, the gate interconnects and the active regions are arranged at the same locations as those of the semiconductor integrated circuit of the first embodiment shown in FIG. 1, but the size and location of the p-type active region POD4 or the n-type active region NOD4 in the gate width direction are changed. In this configuration, the centers of the active regions POD3, NOD3, POD4, and NOD4 in FIG. 2 in the gate width direction are represented as Wcenter_p3, Wcenter_n3, Wcenter_p4, and Wcenter_n4, respectively. FIG. 3A is a graph showing an example of the result obtained by estimating the difference $\Delta Vth\_p$ of the threshold voltage Vth4 of PTr4 from the threshold voltage Vth3 of PTr3 in the case where in FIG. 2 the gate widths of the active regions of the p-channel transistors PTr3 and PTr4 are represented as Wp3 and Wp4, respectively, and the difference $\Delta Wcenter\_p$ between Wcenter_p3 and Wcenter_p4 is changed. This estimation was carried out in the manner in which Wp3 is fixed and Wp4 is changed. FIG. 3B is a graph showing an example of estimation of the n-channel transistor carried out in the same manner as shown in FIG. 3A. In these figures, both of the p- and n-type transistors have gate widths satisfying $W^*\_a<W^*\_b<W^*\_c<W^*\_d<W^*\_e$ (* is p-type or n-type). $W^*\_a$, $W^*\_b$, $W^*\_c$, $W^*\_d$, and $W^*\_e$ were set at 0.25 to 1.5 μm in about 0.25 μm increments.

From FIGS. 3A and 3B, it is found that for both of the p- and n-type transistors, the smaller the gate width of one transistor is, the greater the influence of characteristic fluctuation of the other transistor affected by the well proximity effect becomes. Moreover, it is also found that among the transistors having either of the conductivity types, the center locations of the active regions in the gate width direction measured from the well boundary are equalized among the transistors with different gate widths provided in each of the standard cell series, whereby characteristic fluctuation affected by the well proximity effect can be prevented to the largest extent. Also from these findings, it is confirmed that with the semiconductor integrated circuit according to the first embodiment, circuit design with the relative characteristics of the cells kept can be carried out and circuit simulation with high accuracy can be performed in a relatively short period.

According to "THE INTERNATIONAL TECHNOLOGY ROADMAP FOR SEMICONDUCTORS 2005, Modeling and Simulation, pp. 29" (Document 1), the simulation accuracy of threshold voltage obtained by a circuit simulator is required to have a value of ±3% throughout generations. It is found that letting the transistor threshold voltage be 200 to 300 mV, ΔWcenter sufficient to secure this accuracy is about ±0.25 μm. Therefore, the center locations (or the location of the center line) of the active regions of the transistors having different sizes in the single well as seen in the gate width direction are allowed to fall within ±0.25 μm with reference to the well boundary, whereby simulation accuracy sufficiently suitable for practical use can be secured. However, the values described above are not absolute, and they are scaled as appropriate according to advancement of miniaturization.

Next, the semiconductor integrated circuit according to the first embodiment can be designed in the following manner.

First, a standard cell is prepared. For a CMIS, as the standard cell, use can be made of a cell in which transistors with different gate widths have equalized distances from the well boundary to the centers of the active regions as shown in, for example, FIG. 1. In this structure, in equalizing the distances from the well boundary to the centers of the active regions, arrangement of the transistors is made so that the center locations of the active regions of the transistors in the gate width direction are aligned with the center location of the active region having a maximum size in the gate width direction. STIp1 and STIn1 are set in principle at a minimum size defined by a design rule. Then, this standard cell is placed as appropriate with an automated design tool and the like, thereby fabricating a system LSI.

Next, whether or not the fabricated circuit operates as designed is checked with a circuit simulation or the like. During the circuit simulation, from mask layout of the designed cell, a net list including information on elements such as transistors, capacitors, and resistors is extracted using an LPE, and the extracted list is supplied to the circuit simulator. Based on the result of this simulation, circuit design is modified if required.

With the semiconductor integrated circuit according to the first embodiment, highly accurate simulation as described above can be performed in a relatively short period. Therefore, the period of integrated circuit design can be cut to reduce the cost of LSI development.

In the semiconductor integrated circuit according to the first embodiment, in consideration of easiness of design, the n-type well NW1, the p-type well PW1, and the active regions are shaped in quadrangular forms (to be exact, in substantially quadrangular forms due to impurity diffusion). However, these may be shaped in other forms.

If the distance from the end of the active region to the well boundary is beyond 1 μm, the influence of the well proximity effect lessens. Thus, the design method according to the first embodiment can exert a significant effect especially in designing a semiconductor integrated circuit having a fine scale such that the distance from the end of the active region to the well boundary is 1 μm or smaller.

Second Embodiment

Figure 4:
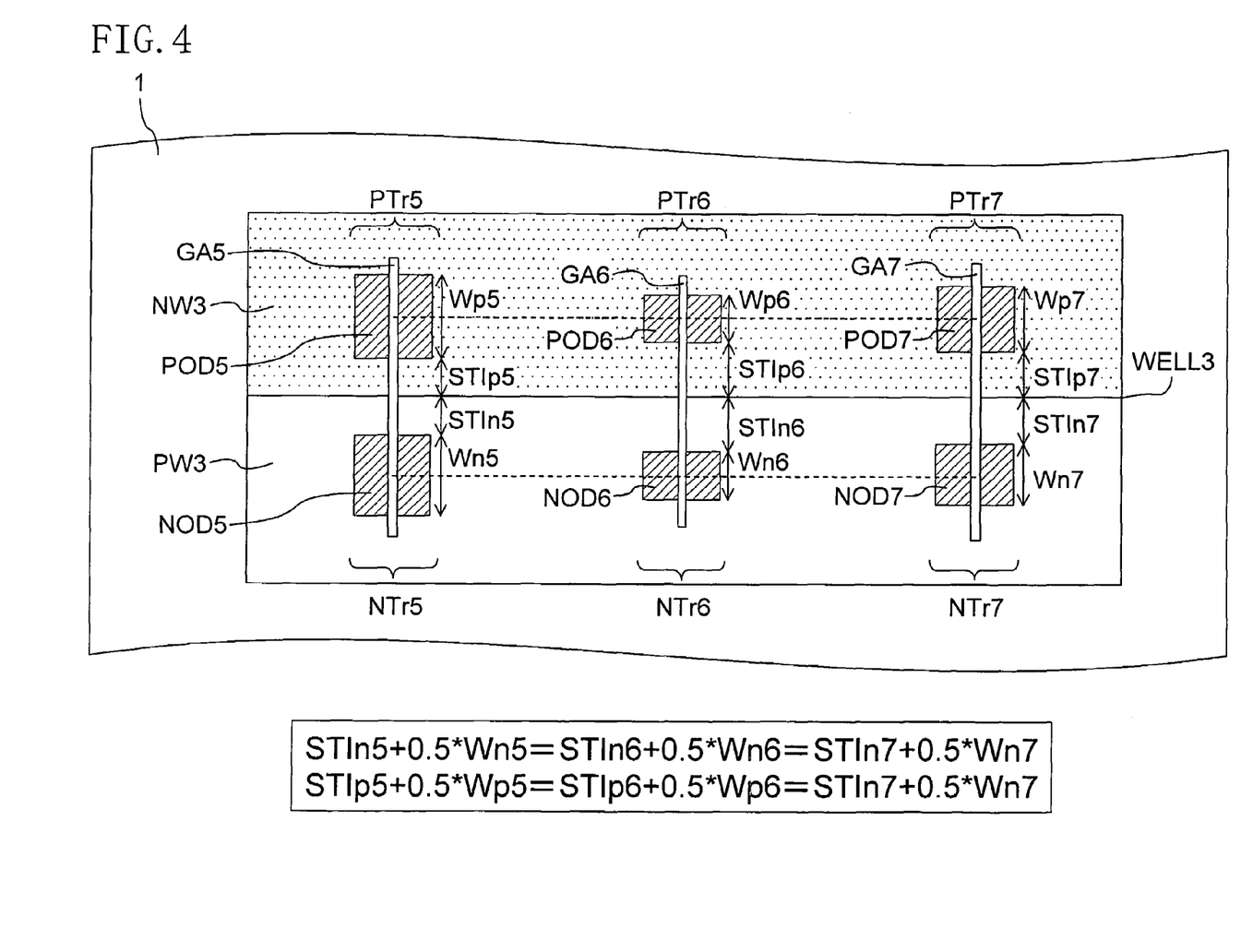
FIG. 4 is a plan view showing the structure of a standard cell constituting a semiconductor integrated circuit according to a second embodiment of the present invention.

FIG. 4 is a plan view showing the structure of a standard cell constituting a semiconductor integrated circuit according to a second embodiment of the present invention. In the semiconductor integrated circuit according to the second embodiment, each of wells in the standard cell is provided with three transistors having different sizes, respectively.

Referring to FIG. 4, p-type active regions POD5, POD6, and POD7 having gate widths of Wp5, Wp6, and Wp7, respectively, are arranged in an n-type well NW3 formed in a substrate 1. Also, n-type active regions NOD5, NOD6, and NOD7 having gate widths of Wn5, Wn6, and Wn7, respectively, are arranged in a p-type well PW3 formed in the substrate 1. Above the p-type active regions POD5, POD6, and POD7 and the n-type active regions NOD5, NOD6, and NOD7, gate interconnects GA5, GA6, and GA7 are provided with respective gate insulating films (not shown) interposed therebetween.

P-channel transistors PTr5, PTr6, and PTr7 are provided in the n-type well NW3. PTr5 has the p-type active region POD5 and a portion of the gate interconnect GA5, PTr6 has the p-type active region POD6 and a portion of the gate interconnect GA6, and PTr7 has the p-type active region POD7 and a portion of the gate interconnect GA7.

N-channel transistors NTr5, NTr6, and NTr7 are provided in the p-type well PW3. NTr5 has the n-type active region NOD5 and a portion of the gate interconnect GA5, NTr6 has the n-type active region NOD6 and a portion of the gate interconnect GA6, and NTr7 has the n-type active region NOD7 and a portion of the gate interconnect GA7.

In this configuration, in PTr5, the distance from the well boundary WELL3 to the end of POD5 is represented as STIp5. In NTr5, the distance from the well boundary WELL3 to the end of NOD5 is represented as STIn5. In PTr6, the distance from the well boundary WELL3 to the end of POD6 is represented as STIp6. In NTr6, the distance from the well boundary WELL3 to the end of NOD6 is represented as STIn6. In PTr7, the distance from WELL3 to the end of POD7 is represented as STIp7. In NTr7, the distance from the well boundary WELL3 to the end of NOD7 is represented as STIn7.

In this configuration, the center locations of the active regions of the p-channel transistors PTr5, PTr6, and PTr7 with reference to the well boundary WELL3 are aligned. Likewise, the center locations of the active regions of the n-channel transistors NTr5, NTr6, and NTr7 with reference to the well boundary WELL3 are aligned. This configuration is designed in the manner in which the sizes of the active regions provided in the standard cell are extracted with an LPE or the like and then the centers of the active regions in the gate width direction are aligned with the center location of the active region having a maximum size in the gate width direction.

In this arrangement, the distances from the well boundary to the centers of the active regions in the gate width direction satisfy the following equations:

$$\{STIp5+0.5\times Wp5(\text{reference})\}=(STIp6+0.5\times Wp6)=(STIp7+0.5\times Wp7) \quad (5)$$

$$\{STIn5+0.5\times Wn5(\text{reference})\}=(STIn6+0.5\times Wn6)=(STIn7+0.5\times Wn7) \quad (6)$$

In these equations, the relation among the gate widths is Wn5>Wn7>Wn6 and Wp5>Wp7>Wp6, and the relation among the distances from the well boundary to the ends of the active regions is STIn5<STIn7<STIn6 and STIp5<STIp7<STIp6.

As described above, even if three or more transistors are provided in a single well, equalizing, among the transistors, the distances from the well boundary to the centers of the respective active regions can suppress variations of the influence of the well proximity effect to minimize characteristic fluctuation of the transistors. Thus, the relative characteristics of the respective transistors are kept even in the case of taking the well proximity effect into consideration, so that highly accurate circuit simulation can be performed in a relatively short period. This facilitates circuit design as compared with the conventional semiconductor integrated circuit, thereby enabling cut of the development period thereof and reduction of the development cost thereof.

Third Embodiment

Figure 5:
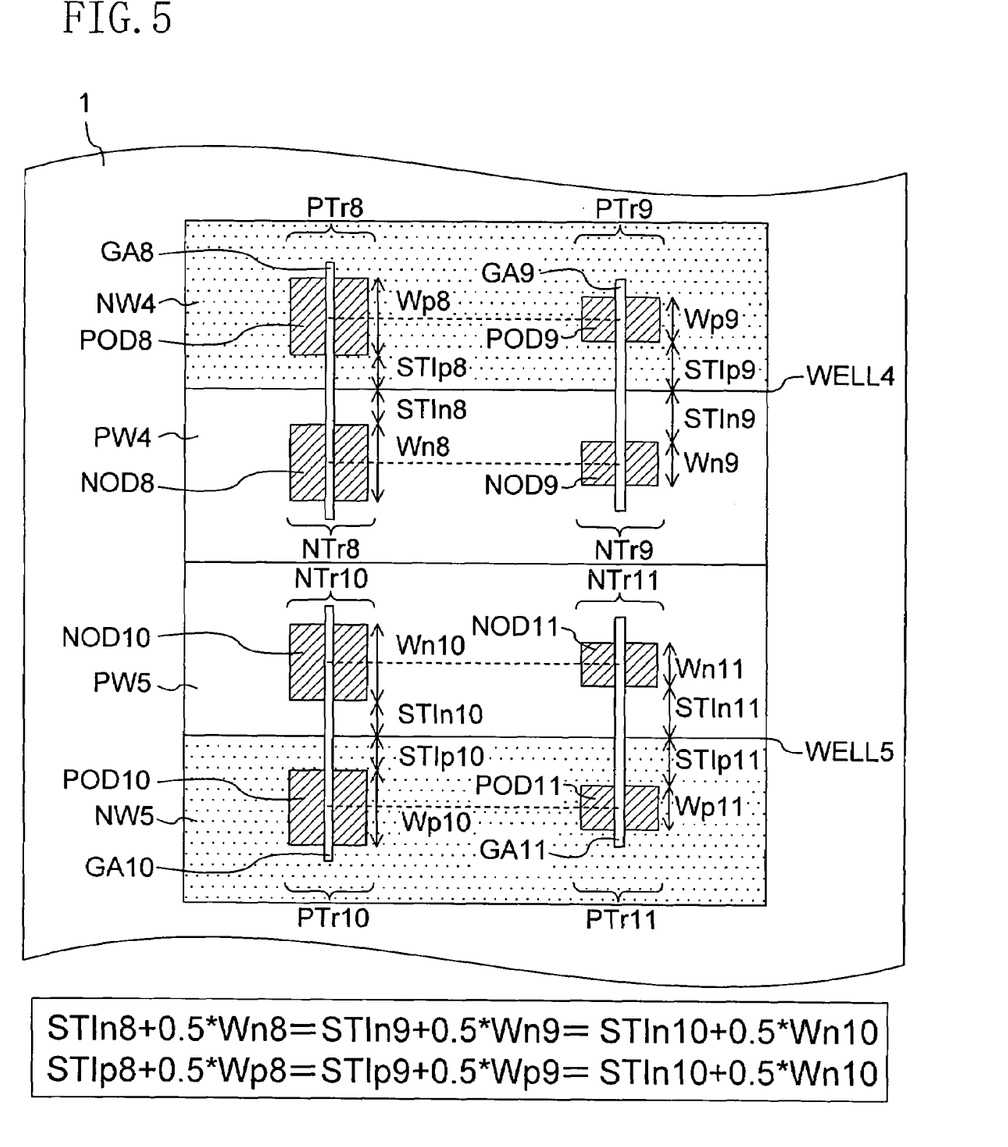
FIG. 5 is a plan view showing the structure of a standard cell constituting a semiconductor integrated circuit according to a third embodiment of the present invention.

FIG. 5 is a plan view showing the structure of a standard cell constituting a semiconductor integrated circuit according to a third embodiment of the present invention.

As shown in FIG. 5, in the standard cell according to the third embodiment, an n-type well NW4, a p-type well PW4 in contact at the well boundary WELL4 with the n-type well NW4, a p-type well PW5 in contact with the p-type well PW4, and an n-type well NW5 in contact at the well boundary WELL5 with the p-type well PW5 are sequentially formed in a substrate 1 from top to bottom in the gate width direction. Although the p-type well PW4 and the p-type well PW5 are separately provided in the third embodiment, a single p-type well may be provided instead of them.

P-type active regions POD8 and POD9 having gate widths of Wp8 and Wp9 (Wp8>Wp9) are arranged in the n-type well NW4, and n-type active regions NOD8 and NOD9 having gate widths of Wn8 and Wn9 (Wn8>Wn9) are arranged in the p-type well PW4. The n-type well NW5 and the p-type well PW5 are made by flipping the structures of the n-type well NW4 and the p-type well PW4 in the gate width direction using the boundary between PW4 and PW5 as the axis. In the n-type well NW5, p-type active regions POD10 and POD11 are arranged which have gate widths of Wp10 and Wp11 and the same shapes as the p-type active regions POD8 and POD9, respectively. In the p-type well PW5, n-type active regions NOD10 and NOD11 are arranged which have gate widths of Wn10 and Wn11 and the same shapes as the n-type active regions NOD8 and NOD9, respectively. In this configuration, a gate interconnect GA8 is provided above POD8 and NOD8, a gate interconnect GA9 is provided above POD9 and NOD9, a gate interconnect GA10 is provided above NOD10 and POD10, and a gate interconnect GA11 is provided above NOD11 and POD11. In the top of the substrate 1, p-channel transistors PTr8, PTr9, PTr10, and PTr11 and n-channel transistors NTr8, NTr9, NTr10, and NTr11 are provided which have the respective active regions and respective portions of the gate interconnects described above.

In this configuration, in PTr8, the distance from WELL4 to the end of POD8 is represented as STIp8. In NTr8, the distance from WELL4 to the end of NOD8 is represented as STIn8. In PTr9, the distance from WELL4 to the end of POD9 is represented as STIp9. In NTr9, the distance from WELL4 to the end of NOD9 is represented as STIn9. In PTr10, the distance from WELL5 to the end of POD10 is represented as STIp10. In NTr10, the distance from WELL5 to the end of NOD10 is represented as STIn10. In PTr11, the distance from WELL5 to the end of POD11 is represented as STIp11. In NTr11, the distance from WELL5 to the end of NOD11 is represented as STIn11.

In this configuration, the center locations of the active regions of the p-channel transistors PTr8 and PTr9 with reference to the well boundary WELL4 are aligned, and also the center locations of the active regions of the p-channel transistors PTr10 and PTr11 with reference to the well boundary WELL5 are aligned. Further, the center locations of the active regions of the n-channel transistors NTr8 and NTr9 with reference to the well boundary WELL4 are aligned, and also the center locations of the active regions of NTr10 and NTr11 with reference to the well boundary WELL5 are aligned. This configuration is designed in the manner in which the sizes of the active regions provided in the standard cell are extracted with an LPE or the like and then the centers of the active regions in the gate width direction are aligned with the center location of the active region in the gate width direction having a maximum gate width. In this arrangement, the distances from the well boundary to the centers of the active regions in the gate width direction satisfy the following equations:

$$\{STIp8+0.5\times Wp8(\text{reference})\}=(STIp9+0.5\times Wp9)= (STIp10+0.5\times Wp10)=(STIp11+0.5\times Wp11) \quad (7)$$

$$\{STIn8+0.5\times Wn8(\text{reference})\}=(STIn9+0.5\times Wn9)= (STIn10+0.5\times Wn10)=(STIn11+0.5\times Wn11) \quad (8)$$

In these equations, the relation among the gate widths is: $Wn8>Wn9$, $Wn10>Wn11$, $Wn8=Wn10$; and $Wn9=Wn11$; and $Wp8>Wp9$, $Wp10>Wp11$, $Wp8=Wp10$, and $Wp9=Wp11$. The relation among the distances from the well boundary to the ends of the active regions is: $STIn8<STIn9$, $STIn10<STIn11$, $STIn8=STIn10$, and $STIn9=STIn11$; and $STIp8<STIp9$, $STIp10<STIp11$, $STIp8=STIp10$, and $STIp9=STIp11$.

As described above, equalizing, among the transistors, the distances from the well boundary to the centers of the respective active regions can suppress variations of the influence of the well proximity effect to minimize characteristic fluctuation of the transistors. Thus, the relative characteristics of the respective transistors are kept even in the case of taking the well proximity effect into consideration, so that highly accurate circuit simulation can be performed in a relatively short period. In this embodiment, the distances from the well boundary to the centers of the active regions are equalized with PTr8 and NTr8 having the maximum distance as shown by the above equations, whereby circuit design can be carried out so that characteristic fluctuation affected by the well proximity effect is minimized.

Moreover, by designing the standard cell so that the well structure is flipped like the third embodiment, an integrated circuit capable of being subjected to highly accurate circuit simulation in a relatively short period can be designed more easily.

Fourth Embodiment

Figure 6:
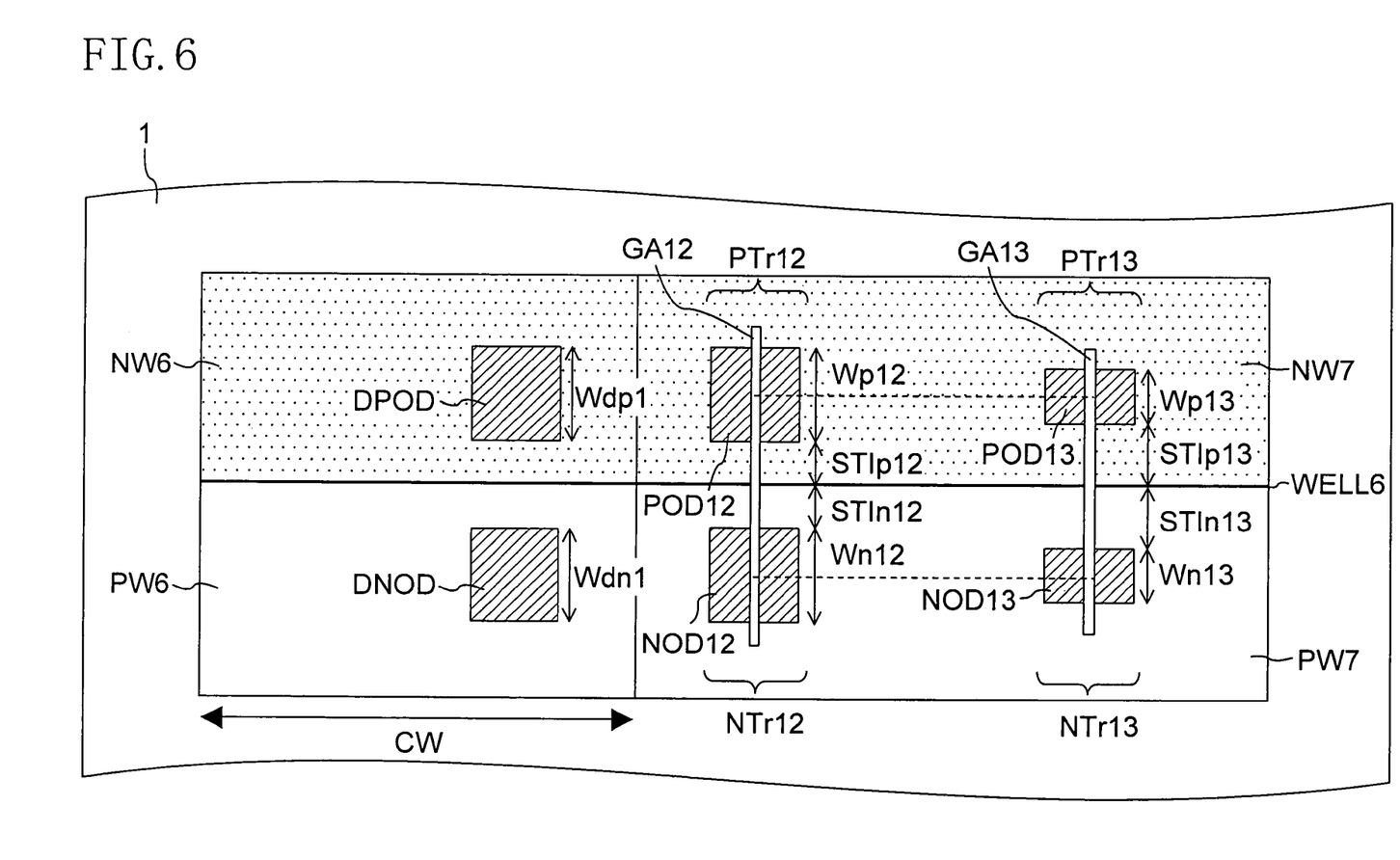
FIG. 6 is a plan view showing the structure of a standard cell constituting a semiconductor integrated circuit according to a fourth embodiment of the present invention.

FIG. 6 is a plan view showing the structure of a standard cell constituting a semiconductor integrated circuit according to a fourth embodiment of the present invention.

In the semiconductor integrated circuit shown in FIG. 6, the standard cell shown in FIG. 1 is arranged in an array (two-dimensionally), and a spacer cell (dummy standard cell) is arranged at the edge of the cell array. In the example in FIG. 6, the dummy standard cell is arranged outside the cell array and along the edge side of the cell array across the gate length direction.

In this configuration, an n-type well NW6 and a p-type well PW6 are arranged in the dummy standard cell. The n-type well NW6 has the same length in the gate width direction as the n-type well NW1 of the standard cell shown in FIG. 1, and the p-type well PW6 has the same length in the gate width direction as the p-type well PW1 shown in FIG. 1. A p-type active region DPOD having a length in the gate width direction of Wdp1 is arranged in the n-type well NW6, and an n-type active region DNOD having a length in the gate width direction of Wdn1 is arranged in the p-type well PW6. In this arrangement, the length CW of the dummy standard cell in the gate length direction is 1.0 μm or more. In this configuration, the p-type active region DPOD and the n-type active region DNOD serve as dummy active regions in which no gate electrode is formed thereabove and they do not operate as a transistor.

In FIG. 6, in a p-channel transistor PTr12 in an n-type well NW7, the distance from the well boundary WELL6 to the end of a p-type active region POD12 is represented as STIp12. In an n-channel transistor NTr12 in a p-type well PW7, the distance from the well boundary WELL6 to the end of NOD12 is represented as STIn12. Likewise, in a p-channel transistor PTr13, the distance from the well boundary WELL6 to the end of POD13 is represented as STIp13. In NTr13, the distance from WELL6 to the end of an n-type active region NOD13 is represented as STIn13.

As shown above, by arranging, on the side of the cell array, the dummy standard cell having a length in the gate length direction of 1.0 μm or more, the transistors of the standard cell located in the edge portion of the cell array can be prevented from being affected by the gate-proximity effect. Moreover, arranging the active regions DPOD and DNOD in the dummy standard cell can suppress variations between: stress applied to the transistors of the standard cell located in the edge portion of the cell array by the adjacent active region; and stress applied to the transistors of the standard cell located in the inner portion of the cell array. Thus, in the semiconductor integrated circuit according to the fourth embodiment, characteristic fluctuation resulting from the well boundary in the gate length direction can be reduced to a smaller extent. Therefore, with the semiconductor integrated circuit according to the fourth embodiment, circuit design with the relative characteristics of the respective transistors kept can be carried out even in the case of taking the well proximity effect into consideration.

In FIG. 6, description has been made of the example in which the dummy standard cell is arranged along the edge side of the standard cell of the cell array across the gate length direction. Alternatively, it may be arranged along the edge side thereof across the gate width direction.

In addition, another configuration may be employed in which a cell array using as a standard cell the structure shown in the second or third embodiment is employed and the dummy standard cell is arranged outside the cell array and along the edge side thereof across the gate length direction.

Fifth Embodiment

Figure 7:
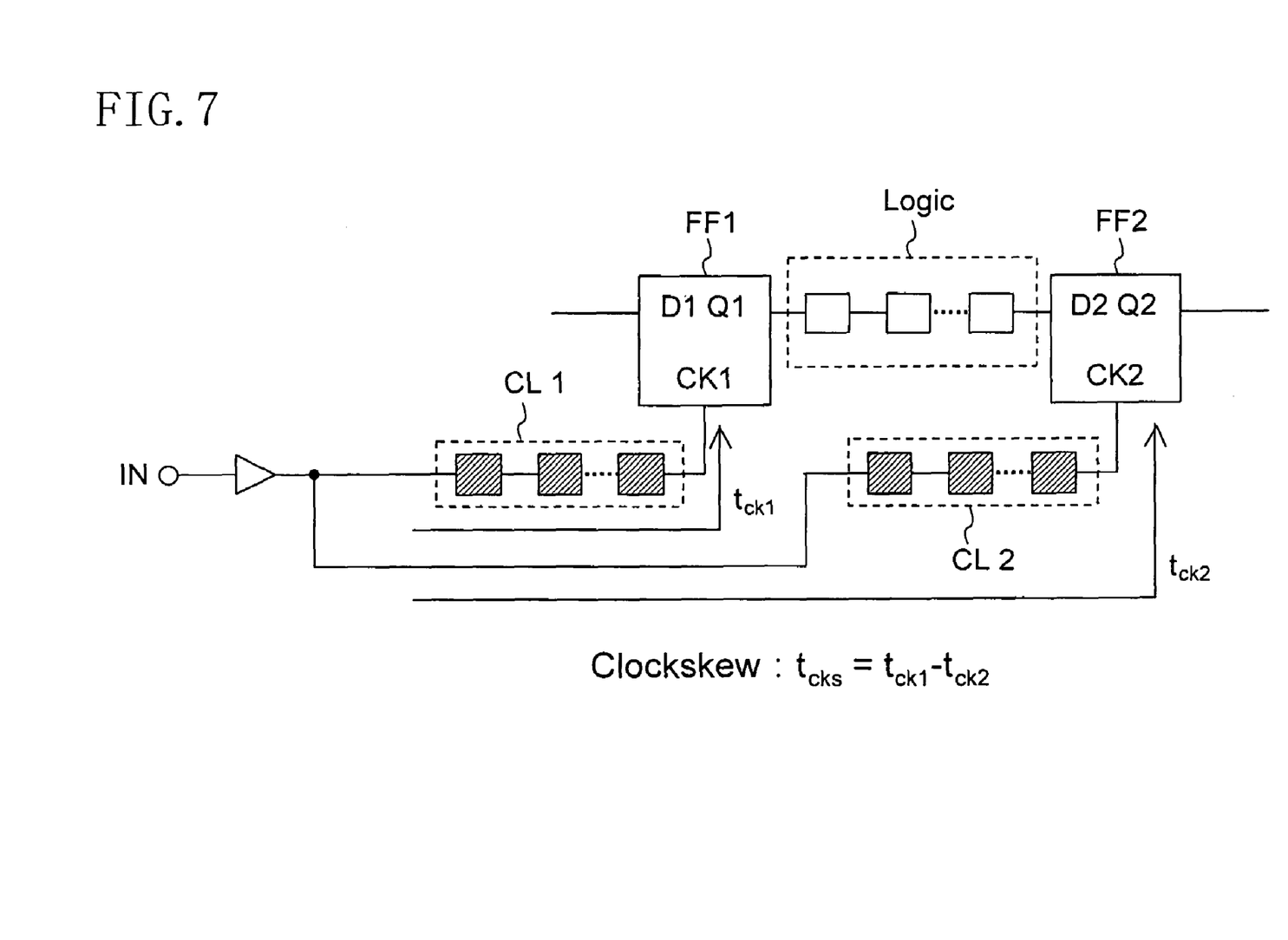
FIG. 7 is a block diagram showing an example of a circuit employing a cell laid out based on the present invention.

FIG. 7 is a block diagram showing an example of a circuit employing a cell laid out based on the present invention.

In the circuit shown in FIG. 7, a signal supplied to an input IN is sent through two signal paths CL1 and CL2 to flip-flops FF1 and FF2, respectively. A logic circuit (Logic) is inserted between the flip-flop FF1 and the flip-flop FF2. The signal paths CL1 and CL2 are composed of respective logic circuits. In this circuit configuration, if the propagation delay times of signals propagating through the signal paths CL1 and CL2 are represented as tck1 and tck2, respectively, the difference between tck1 and tck2 indicates clockskew tcks (tck=tck1−tck2). The clockskew is the lag between the timings at which the signals propagate, wherein this lag occurs resulting from: the difference in the interconnect capacitance between the cells constituting the signal paths such as CL1 and CL2; and the difference therebetween in the clock propagation delay time caused by process variations, characteristic fluctuation depending on the layout, and the like. In this configuration, tcks represents the difference between the delay times of signals propagating through the flip-flop FF1 and the flip-flop FF2, respectively.

With recent rapid advancement of miniaturization, the demand for enhancement of LSI operation speed is growing. In such trend, characteristic fluctuation of a transistor resulting from layout thereof or process variations associated with the miniaturization disadvantageously becomes significant. However, by applying the semiconductor integrated circuit and its design method according to the present invention to the cells constituting the signal paths CL1 and CL2 shown in FIG. 7, the calculation accuracy of delay made by a circuit simulation can be improved to reduce the clockskew. This enables reduction of power consumption, improvement of yield, and the like.

The circuit according to the fifth embodiment is an example of a circuit designed using the standard cell described in the first to fourth embodiments, and application of the standard cell according to the present invention is not limited to such a logic circuit.

As described above, the semiconductor integrated circuit and its design method according to the present invention can be employed for design and development of LSIs of each generation.

What is claimed is:

1. A semiconductor integrated circuit comprising:
 a first well region of a first conductivity type provided in a substrate;
 a second well region of a second conductivity type provided in the substrate and coming into contact with the first well region at a well boundary extending in a gate length direction;
 a first active region provided in the first well region and having first source and drain regions of the second conductivity type; and
 a second active region provided in the first well region, having second source and drain regions of the second conductivity type, and differing in length in a gate width direction from the first active region,
 wherein the distance from the well boundary to a halfway point of the length of the first active region in the gate width direction is substantially the same as the distance from the well boundary to a halfway point of the length of the second active region in the gate width direction.

2. The circuit of claim 1,
 wherein the first active region has a greater length in the gate width direction than the second active region, and
 the distance from the well boundary to an end of the first active region located closer to the well boundary is smaller than the distance from the well boundary to an end of the second active region located closer to the well boundary.

3. The circuit of claim 1, further comprising:
 a first gate electrode formed above the first active region with a first gate insulating film interposed therebetween; and
 a second gate electrode formed above the second active region with a second gate insulating film interposed therebetween.

4. The circuit of claim 1,
 wherein the second active region is spaced in the gate length direction from the first active region.

5. The circuit of claim 1, further comprising:
 a third active region provided in the second well region, arranged axisymmetrically with respect to the first active region with the well boundary used as an axis, and having third source and drain regions of the first conductivity type; and
 a fourth active region provided in the second well region, arranged axisymmetrically with respect to the second active region with the well boundary used as an axis, and having fourth source and drain regions of the first conductivity type,
 wherein the distance from the well boundary to a halfway point of the length of the third active region in the gate width direction is substantially the same as the distance from the well boundary to a halfway point of the length of the fourth active region in the gate width direction with reference to the well boundary.

6. The circuit of claim 5,
 wherein the third active region has the same shape as the first active region, and
 the fourth active region has the same shape as the second active region.

7. The circuit of claim 5, further comprising:
 a third gate electrode formed above the third active region with a third gate insulating film interposed therebetween; and
 a fourth gate electrode formed above the fourth active region with a fourth gate insulating film interposed therebetween,
 wherein the first and third gate electrodes are portions of an integrally-formed first gate interconnect, and
 the second and fourth gate electrodes are portions of an integrally-formed second gate interconnect.

8. The circuit of claim 1,
wherein a cell including the first well region and the second well region is arranged two-dimensionally to constitute a cell array, and
the circuit further comprises a spacer cell arranged outside the cell array in alignment in the gate length direction and along either one side of the cell array extending in the gate width direction.

9. The circuit of claim 8,
wherein the spacer cell has a length in the gate length direction of 1.0 μm or more.

10. The circuit of claim 8,
wherein a dummy active region is provided in the spacer cell.

11. The circuit of claim 1, further comprising a fifth active region provided in the first well region, having fifth source and drain regions of the second conductivity type, and differing in length in the gate width direction from the first and second active regions,
wherein the distance from the well boundary to a halfway point of the length of the fifth active region in the gate width direction is substantially the same as the distance from the well boundary to a halfway point of the length of the first active region in the gate width direction with reference to the well boundary.

* * * * *